(12) United States Patent
Yoshida (10) Patent No.: US 8,749,878 B2
(45) Date of Patent: Jun. 10, 2014

(54) SEMICONDUCTOR OPTICAL AMPLIFIER DEVICE

(75) Inventor: Setsuo Yoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 707 days.

(21) Appl. No.: 12/704,654

(22) Filed: Feb. 12, 2010

(65) Prior Publication Data
US 2010/0208335 A1   Aug. 19, 2010

(30) Foreign Application Priority Data
Feb. 13, 2009   (JP) .................................. 2009-30993

(51) Int. Cl.
*H01S 5/00* (2006.01)
*H04B 10/12* (2006.01)

(52) U.S. Cl.
USPC ............................................................. 359/344

(58) Field of Classification Search
USPC ........................................................ 359/344
See application file for complete search history.

(56) References Cited

U.S. PATENT DOCUMENTS

| 5,463,648 | A * | 10/1995 | Gibbs ........................ 372/38.02 |
| 5,663,975 | A * | 9/1997 | Yoshida et al. ............ 372/46.01 |
| 6,751,013 | B1 * | 6/2004 | Wu .............................. 359/337 |
| 7,545,836 | B1 * | 6/2009 | Borschowa et al. ............. 372/6 |
| 2003/0165306 | A1 * | 9/2003 | Iida et al. .......................... 385/92 |
| 2004/0062557 | A1 | 4/2004 | Takashima et al. |
| 2009/0168817 | A1 * | 7/2009 | Ishikawa et al. ................ 372/20 |

FOREIGN PATENT DOCUMENTS

| JP | 2003309318 A | * 10/2003 | .............. H01S 5/042 |
| JP | 2004-120669 A | 4/2004 |
| JP | 2004-179233 A | 6/2004 |
| JP | 2007-95768 | 4/2007 |

OTHER PUBLICATIONS

Qiao et al., "Choices, Features and Issues in Optical Burst Switching", Optical Networks Magazine 1 (2) pp. 36-44 (2000).*
Jun, Endo et al., "An SOA Based Optical Preamplifier With the Automatic Gain/Loss Controlled Circuit for Wide Input Dynamic Range", *Technical Report of IEICE*,CPM 2001-125, vol. 101, No. 517 English-language Abstract.
Japanese Office Action mailed Nov. 13, 2012 for corresponding Japanese Application No. 2009-030993, with Partial English-language Translation.

* cited by examiner

*Primary Examiner* — Eric Bolda
(74) *Attorney, Agent, or Firm* — Fujitsu Patent Center (57) ABSTRACT

An apparatus including a semiconductor optical amplifier configured to amplify an input optical signal, and a controller configured to supply preheat current to the semiconductor optical amplifier when the input optical signal is not input to the semiconductor optical amplifier.

12 Claims, 9 Drawing Sheets

SEMICONDUCTOR OPTICAL AMPLIFIER DEVICE

CROSS-REFERENCE TO RELATED APPLICATION

This application is based upon and claims the benefit of priority of the prior Japanese Patent Application No. 2009-30993 filed on Feb. 13, 2009, the entire contents of which are incorporated herein by reference.

FIELD

Embodiments discussed herein are related to a semiconductor optical amplifier apparatus.

BACKGROUND

Semiconductor optical amplifiers (SOAs) typically have optical amplification factors that vary under different conditions. For example, the optical amplification factor of a semiconductor optical amplifier has a correlation with temperature. More specifically, the optical amplification factor of a semiconductor optical amplifier increases with a decrease in the temperature of an active layer of the semiconductor optical amplifier and decreases with an increase in the temperature of the active layer. Therefore, the temperature of the semiconductor optical amplifier is controlled using a thermoelectric cooler (TEC).

Furthermore, the optical amplification factor of a semiconductor optical amplifier has a correlation with driving current supplied to an active layer thereof. More specifically, the optical amplification factor of a semiconductor optical amplifier increases with an increase in driving current and decreases with a decrease in driving current. Accordingly, a technology for controlling the optical amplification factor of a semiconductor optical amplifier by using driving current is disclosed (for example, "The Institute of Electronics, Information and Communication Engineers (IEICE) Technical Report, CPM, electronic parts and materials (CPM 2001-125)," Vol. 101, No. 517 (20011214) pp. 23-28 (The Institute of Electronics, Information and Communication Engineers ISSN: 09135685)).

SUMMARY

According to an aspect of an embodiment, an apparatus includes a semiconductor optical amplifier configured to amplify an input optical signal, and a controller configured to supply preheat current to the semiconductor optical amplifier when the input optical signal is not input to the semiconductor optical amplifier.

It is to be understood that both the foregoing summary description and the following detailed description are exemplary and explanatory and are not restrictive of the invention, as claimed.

DESCRIPTION OF EMBODIMENTS

Figure 1:
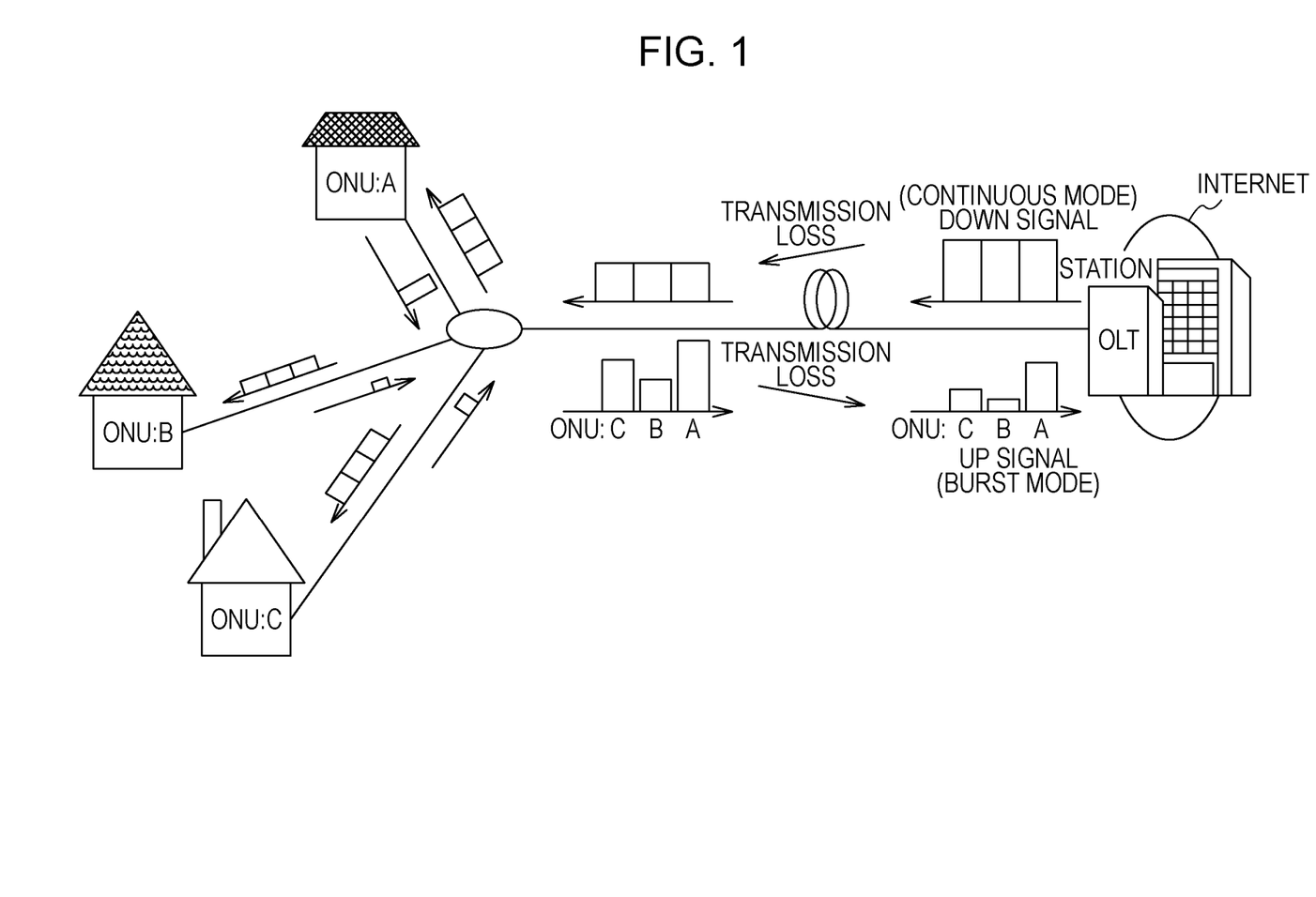
FIG. 1 is a schematic view of a PON system to which a semiconductor optical amplifier device according to a first embodiment of the present invention is applied.

FIG. 1 is a schematic view of a passive optical network (PON) system to which a semiconductor optical amplifier device 100 according to a first embodiment of the present invention is applied. As illustrated in FIG. 1, in the downward direction in which an optical signal is transmitted from an optical line terminal (OLT) of an Internet station to each optical network unit (ONU), an optical signal of substantially the same optical intensity is continuously transmitted. Therefore, variations in the light intensity do not occur in each optical signal.

On the other hand, in the forward direction in which an optical signal is transmitted from each ONU to the OLT, since each optical signal is combined in an optical coupler, an optical signal is non-continuously transmitted, and variations in the light intensity occur in each optical signal. Therefore, in the forward direction, variations occur in the light intensity of each optical signal, and a case in which an optical signal exists and a case in which an optical signal does not exist. This optical signal may be referred to as an optical burst signal. The semiconductor optical amplifier device 100 according to the present embodiment is disposed in the OLT and amplifies an optical burst signal input in the forward direction.

Figure 2A:
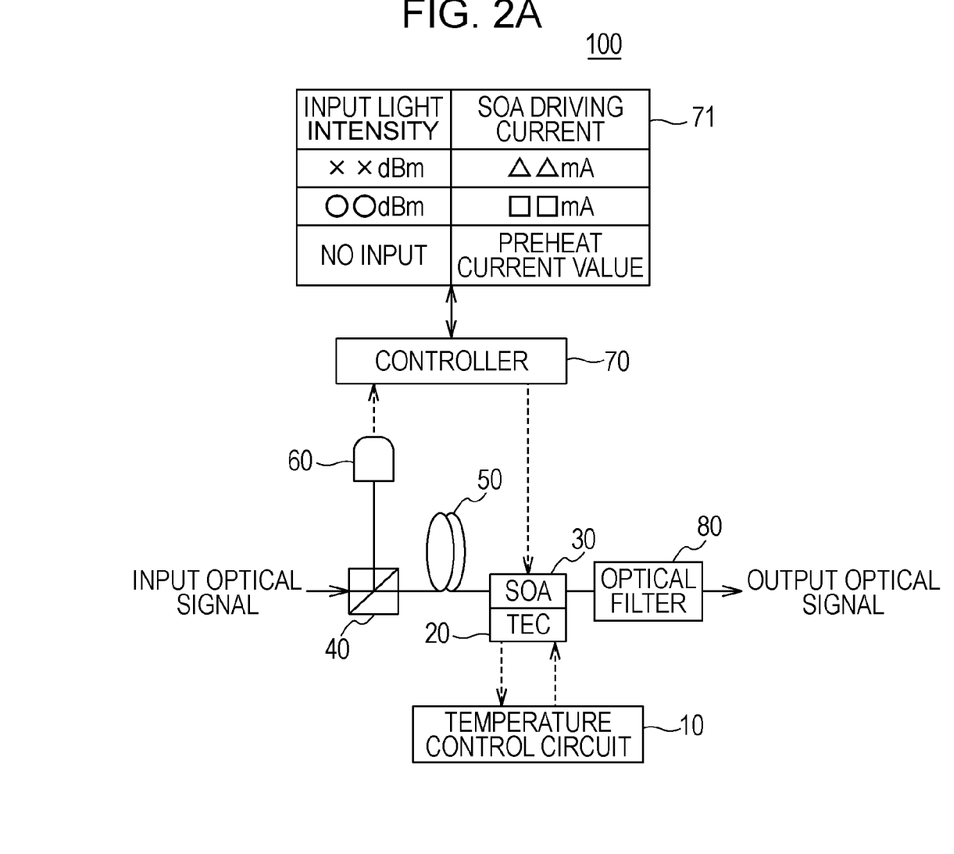
FIG. 2A is a schematic view illustrating the configuration of an entire semiconductor optical amplifier device according to an embodiment.
Figure 2B:
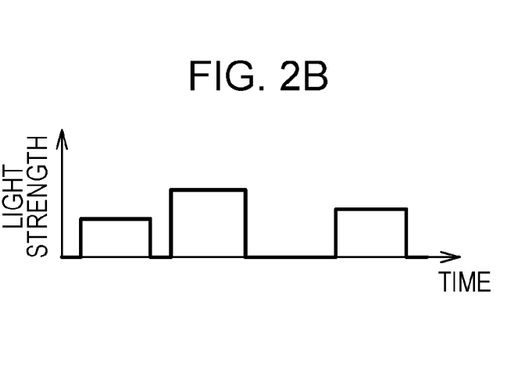
FIG. 2B illustrates an optical burst signal.

FIG. 2A is a schematic view illustrating the configuration of the semiconductor optical amplifier device 100 according to an embodiment. FIG. 2B illustrates an optical burst signal.

As illustrated in FIG. 2A, the semiconductor optical amplifier device 100 includes a temperature control circuit 10, a thermo-electric cooler 20, a semiconductor optical amplifier 30, a beam splitter 40, a delay unit 50, a power monitor 60, a controller 70, and an optical filter 80. As illustrated in FIG. 2B, an optical burst signal has a state in which an optical signal exists and a state in which an optical signal does not exist.

The temperature control circuit 10 supplies TEC driving current to the thermo-electric cooler 20 so that a temperature of the surface on which the elements of the thermo-electric cooler 20 are mounted is maintained substantially constant. Examples of the thermo-electric cooler 20 include a Peltier device. The semiconductor optical amplifier 30 is mounted on the surface on which the elements of the thermo-electric cooler 20 are mounted. Since the temperature of the surface on which the elements of the thermo-electric cooler 20 are mounted is maintained substantially constant, the temperature of the semiconductor optical amplifier 30 is controlled.

The beam splitter 40 splits an input optical burst signal in two directions. One of the split optical burst signals passes through the delay line 50 and is input to the semiconductor optical amplifier 30. The delay unit 50 is a delay line that provides a delay of the optical burst signal by a given time period. In the semiconductor optical amplifier 30, the optical burst signal is amplified in accordance with the driving current supplied to the active layer. The other split optical burst signal is input to the power monitor 60. The power monitor 60 detects the light intensity of the input optical burst signal and supplies the detection result to the controller 70.

The controller 70 includes a central processing unit (CPU), a non-volatile memory (read only memory (ROM)), a volatile memory (random access memory (RAM)), and the like. The controller 70 has a correspondence table 71 indicating the correspondence between light intensities of an optical burst signal input to the semiconductor optical amplifier 30 and driving currents stored therein in advance in the non-volatile memory. The driving currents stored in the correspondence table 71 are electrical currents that are set in such a manner that the light intensity of each optical signal output from the semiconductor optical amplifier 30 is amplified to a fixed value.

By referring to the correspondence table 71, the controller 70 supplies the driving current corresponding to the detection result of the power monitor 60 to the active layer of the semiconductor optical amplifier 30. In this case, the semiconductor optical amplifier 30 is feed-forward-controlled. The amount of delay in the delay line 50 is set in such a manner so as to correspond to the amount of delay that occurs when the controller 70 supplies the driving current to the active layer of the semiconductor optical amplifier 30 in response to the input of an optical burst signal to the power monitor 60. As a result, the time required for control by the controller 70 is cancelled out. The optical filter 80 substantially cuts off noise light (amplified spontaneous emission (ASE)) that is generated in the semiconductor optical amplifier 30.

FIGS. 3A to 3F illustrate the relationship between the temperature of the semiconductor optical amplifier 30 and the gain thereof.

Figure 3A:
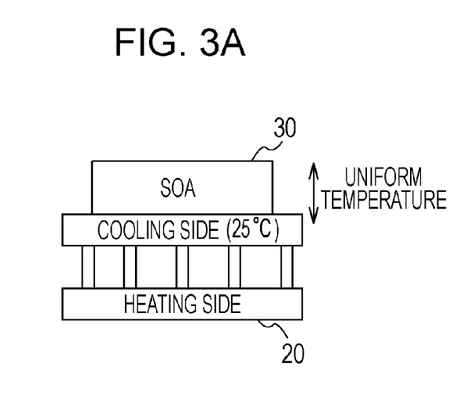
FIGS. 3A, 3B, 3C, 3D, 3E, and 3F illustrate the relationship between the temperature of a semiconductor optical amplifier and the gain thereof.
Figure 3B:
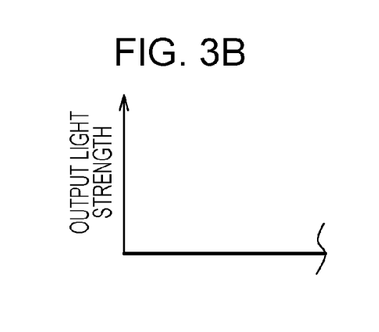

As illustrated in FIG. 3B, in a case where an optical signal is not input to the semiconductor optical amplifier 30, the case that no driving current is supplied as illustrated in FIG. 3A will be considered. In this case, in the semiconductor optical amplifier 30, heat resulting from the driving current is not generated. As a result, when the state in which an optical signal is not input continues, the temperature of the semiconductor optical amplifier 30 becomes approximately equal to the temperature (for example, 25° C.) of the surface on which the elements of the thermo-electric cooler 20 are mounted.

Figure 3C:
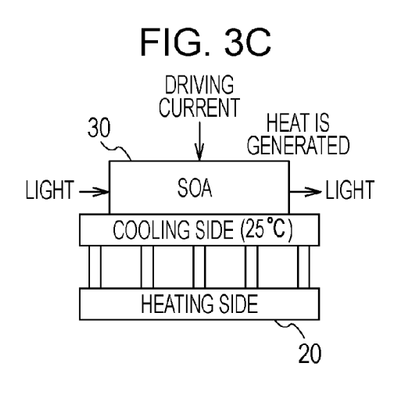
Figure 3D:
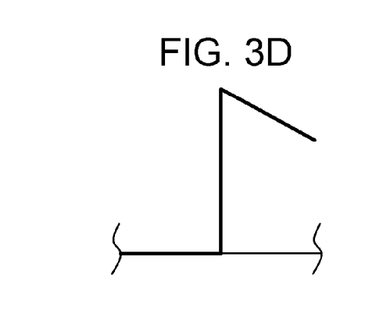

In a case where an optical signal is input after the temperature of the semiconductor optical amplifier 30 becomes approximately equal to the temperature of the element mounted surface of the thermo-electric cooler 20, the optical signal is amplified as a result of the driving current being supplied from the controller 70. In this case, in the semiconductor optical amplifier 30, heat is generated resulting from the driving current (FIG. 3C). As a result, the temperature of the active layer of the semiconductor optical amplifier 30 increases. In consequence, the gain of the semiconductor optical amplifier 30 decreases. As a result, as illustrated in FIG. 3D, the output light intensity from the semiconductor optical amplifier 30 is decreased.

Figure 3E:
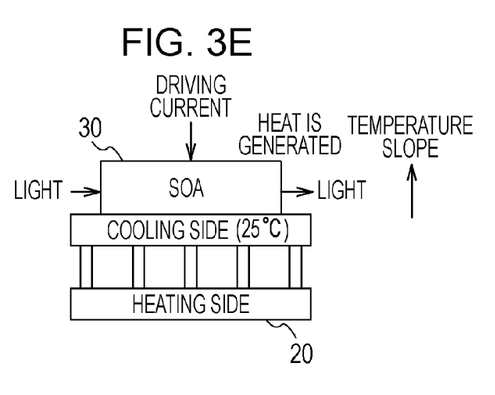
Figure 3F:
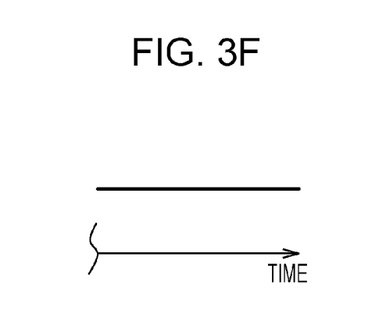

When the state in which the driving current is supplied to the active layer of the semiconductor optical amplifier 30 continues, as illustrated in FIG. 3E, a given temperature slope is formed in the semiconductor optical amplifier 30. In this case, the temperature change of the active layer of the semiconductor optical amplifier 30 is suppressed. As a result, as illustrated in FIG. 3F, the variations in the gain of the semiconductor optical amplifier 30 are suppressed, and the output light intensity is converged.

Figure 4:
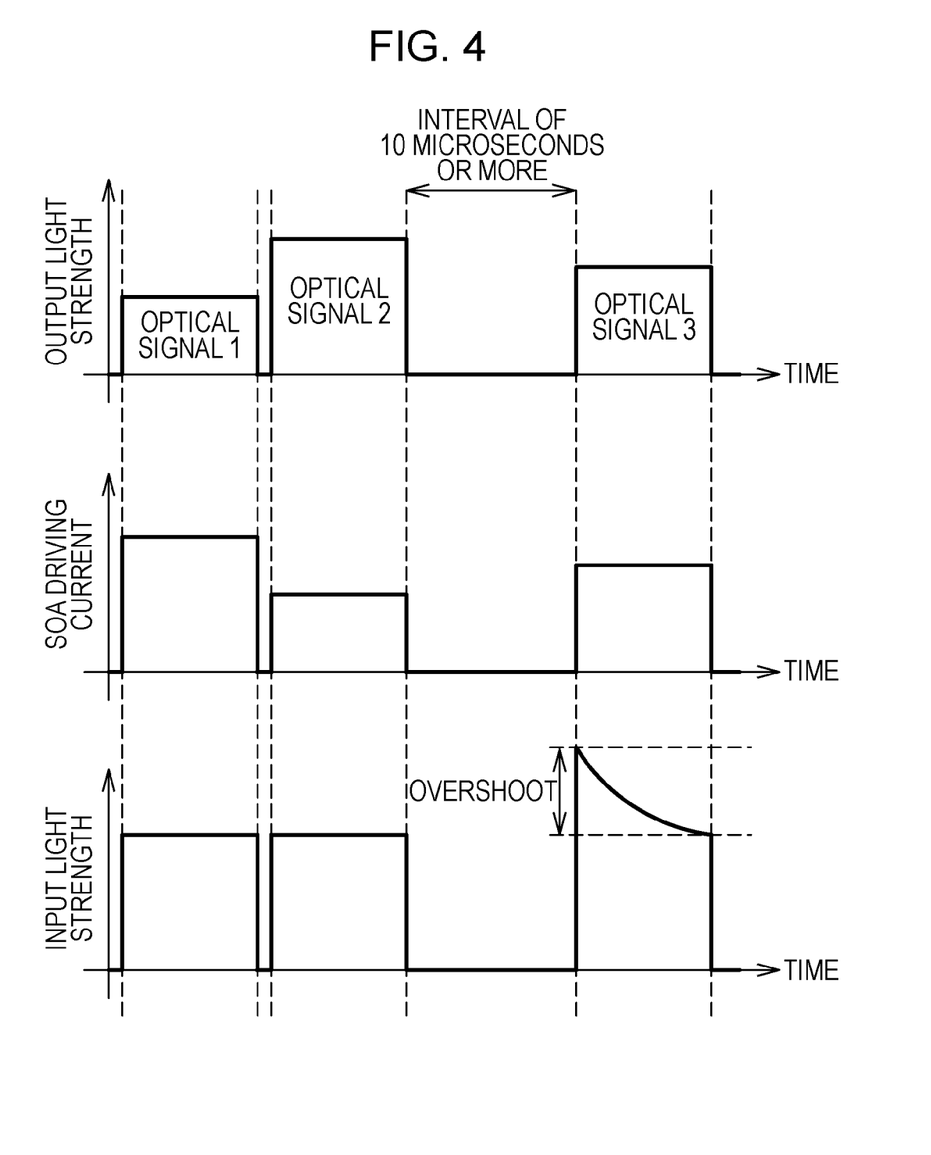
FIG. 4 illustrates output light in a case where a typical optical burst signal is input to a semiconductor optical amplifier.

FIG. 4 illustrates output light in a case where a typical optical burst signal is input to the semiconductor optical amplifier 30. In a case where an optical signal 1 and an optical signal 2 having different light intensities are input at intervals that are not large, the light intensities are amplified to an approximately fixed light intensity in the semiconductor optical amplifier 30. However, it is assumed that, for example, 10 microseconds pass until an optical signal 3 is input after the optical signal 2. In this case, as illustrated in FIGS. 3C to 3F, an overshoot excessive gain occurs.

Therefore, in one embodiment, in a case where an optical signal is not input, preheat current is supplied to the active layer of the semiconductor optical amplifier 30. The controller 70 causes preheat current in the case of no input optical to be stored in the correspondence table 71. The magnitude of the preheat current is, for example, approximately equal to that of the electrical current that flows as a result of the diode threshold voltage of the semiconductor optical amplifier 30 being applied. A description will be given below, with reference to FIGS. 5A to 5F, of the relationship between the temperature of the semiconductor optical amplifier 30 and the gain thereof in a case where preheat current is supplied to the active layer of the semiconductor optical amplifier 30.

Figure 5A:
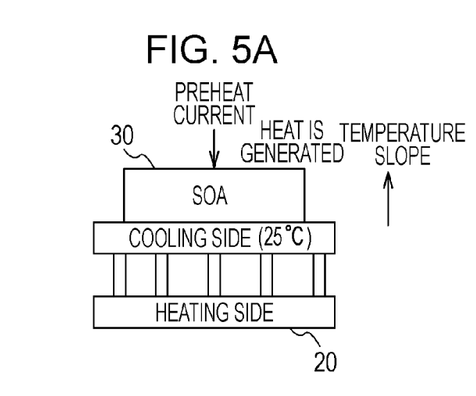
FIGS. 5A, 5B, 5C, 5D, 5E, and 5F illustrate the relationship between the temperature of a semiconductor optical amplifier and the gain thereof in a case where preheat current is supplied to the semiconductor optical amplifier.
Figure 5B:
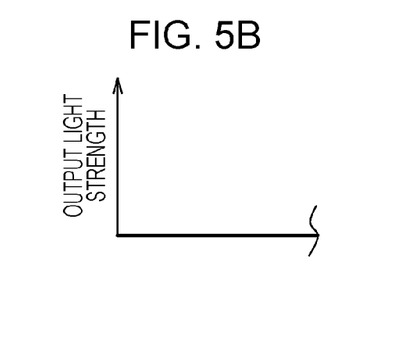
Figure 5C:
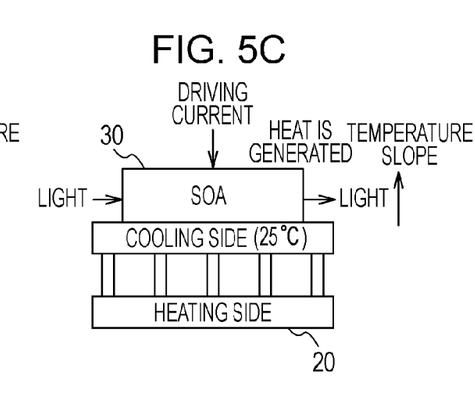

In a case where no optical signal is input to the semiconductor optical amplifier 30 as illustrated in FIG. 5B, predetermined preheat current is supplied to the active layer of the semiconductor optical amplifier 30 as illustrated in FIG. 5A. In this case, in the semiconductor optical amplifier 30, heat is generated resulting from the preheat current. As a result, a given temperature slope is formed in the semiconductor optical amplifier 30, and the temperature of the active layer of the semiconductor optical amplifier 30 becomes higher than the temperature of the element mounted surface of the thermo-electric cooler 20.

Figure 5D:
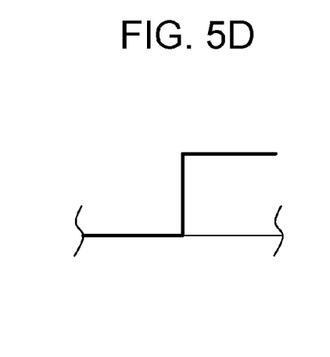

Next, in a case where an optical signal is input as illustrated in FIG. 5D, driving current is supplied to the active layer of the semiconductor optical amplifier 30 in accordance with the correspondence table 71. As a result, in the semiconductor optical amplifier 30, the optical signal is amplified. In this case, since a temperature slope has already been formed in the semiconductor optical amplifier 30, the temperature change in the active layer of the semiconductor optical amplifier 30 is decreased. As a result, the change in the output light intensity of the semiconductor optical amplifier 30 is decreased.

Figure 5E:
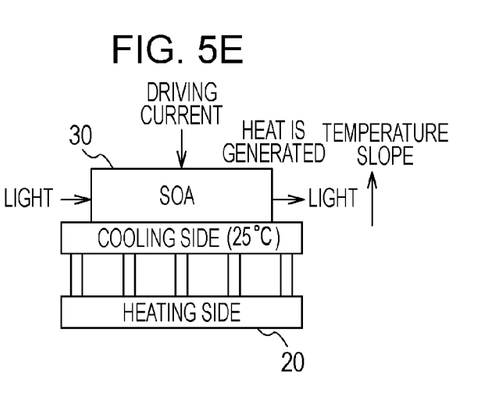
Figure 5F:
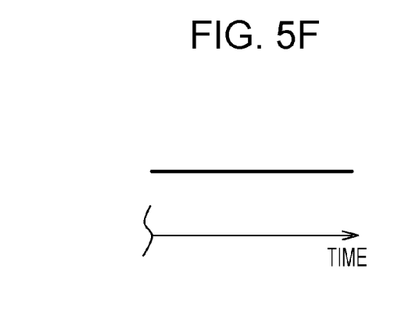

Even if the state in which driving current is supplied to the active layer of the semiconductor optical amplifier 30 continues, as illustrated in FIG. 5E, a temperature slope similar to that of FIG. 4A is formed in the semiconductor optical amplifier 30. In consequence, temperature changes in the active layer of the semiconductor optical amplifier 30 are suppressed. As a result, as illustrated in FIG. 5F, changes in the output light intensity of the semiconductor optical amplifier 30 are decreased.

Figure 6:
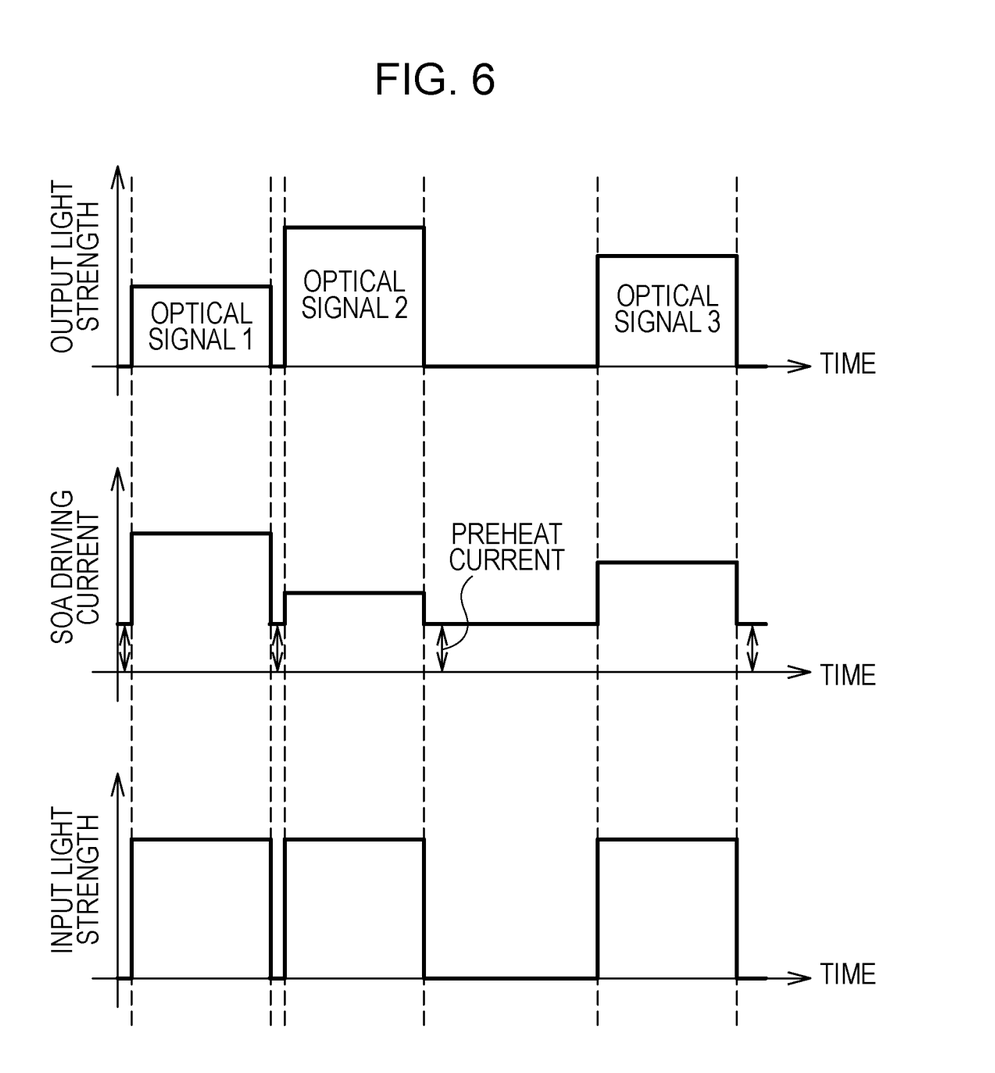
FIG. 6 illustrates output light in a case where an optical burst signal is input to a semiconductor optical amplifier as in FIG. 4.

FIG. 6 illustrates output light in a case where an optical burst signal is input to the semiconductor optical amplifier 30 as in FIG. 4. In a case where an optical signal 1 and an optical signal 2 having different light intensities are input at intervals that are not large, the light intensities are amplified to an approximately fixed light intensity in the semiconductor optical amplifier 30. At intervals of each optical signal, preheat current is supplied to the active layer of the semiconductor optical amplifier 30. In consequence, the semiconductor optical amplifier 30 is preheated. As a result, even if the period in which an optical signal 3 is input after the optical signal 2 is increased, an overshoot excessive gain is suppressed.

As described above, by supplying preheat current to the active layer of the semiconductor optical amplifier 30 in a case where no optical signal is input, variations in the gain of the semiconductor optical amplifier to which the optical burst signal is input may be suppressed. As a result, it is possible to suppress an overshoot excessive gain. Noise generated in the semiconductor optical amplifier 30 resulting from the preheat current is substantially cut off by the optical filter 80.

Figure 7:
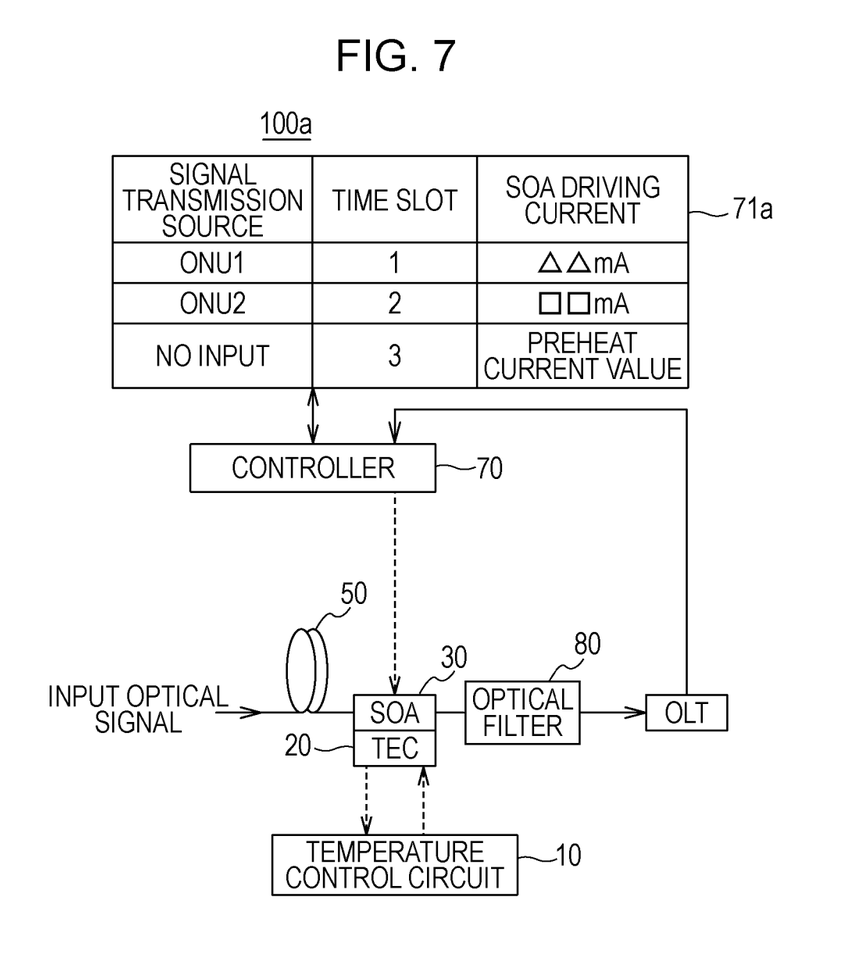
FIG. 7 is a schematic view illustrating the configuration of an entire semiconductor optical amplifier device according to a second embodiment of the present invention.

FIG. 7 is a schematic view illustrating the configuration of an entire semiconductor optical amplifier device 100a according to a second embodiment of the present invention. As illustrated in FIG. 7, the differences of the semiconductor optical amplifier device 100a from the semiconductor optical amplifier device 100 of FIG. 2 are that the power monitor 60 is not provided and a correspondence table 71a in place of the correspondence table 71 is stored in the controller 70. In the correspondence table 71a, the correspondence among signal transmission sources in the forward direction, time slots, and driving currents are stored. The preheat current values are stored so as to cope with a case in which a signal transmission source does not exist.

In this embodiment, the OLT supplies the transmission source of an optical signal in the forward direction and a time slot to the controller 70. The controller 70 obtains the driving current from the correspondence table based on the transmission source and the time slot supplied from the OLT. As a result, the gain of the semiconductor optical amplifier 30 is controlled based on the transmission source. With respect to a time slot in which there is no transmission source (input optical signal does not exist), preheat current is supplied to the active layer of the semiconductor optical amplifier 30. As a result, variations in the gain in the semiconductor optical amplifier 30 are suppressed. As a result, an overshoot excessive gain is suppressed. Furthermore, a power monitor and a beam splitter may not be provided. Therefore, it is possible to reduce costs.

Figure 8:
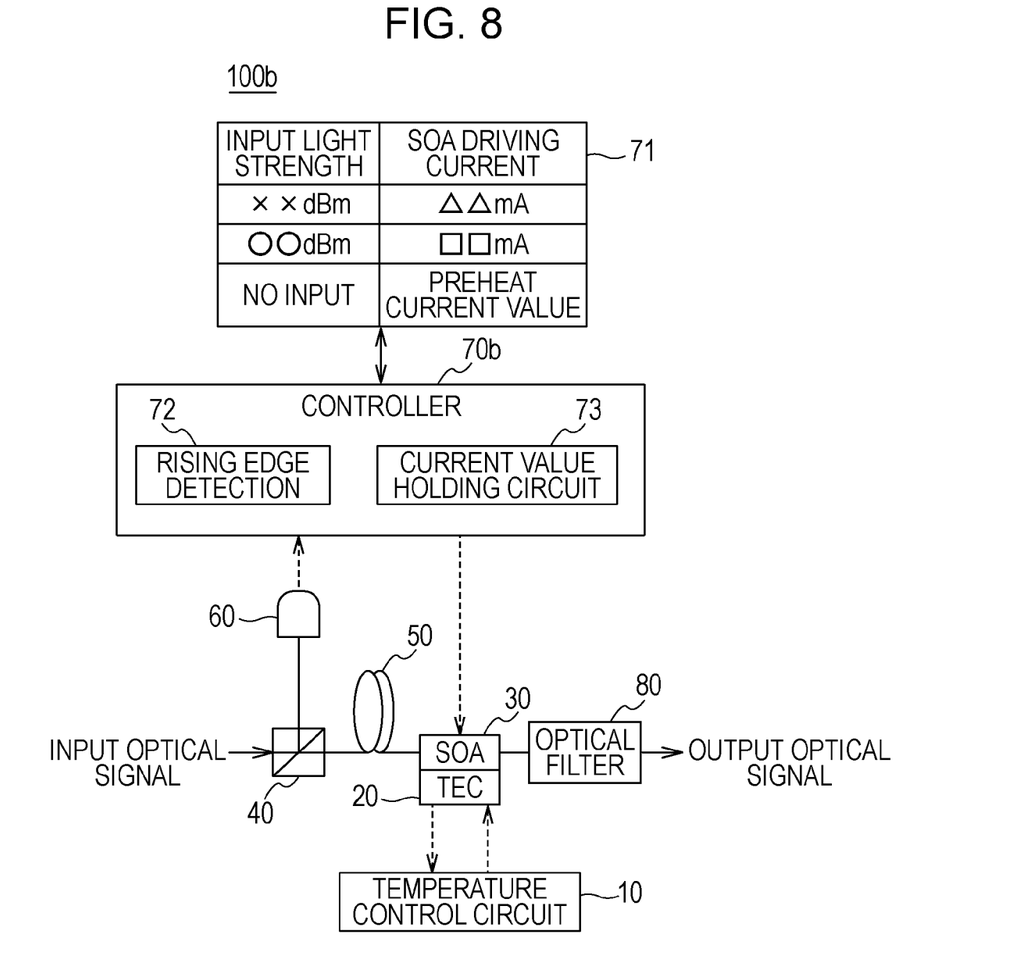
FIG. 8 is a schematic view illustrating the configuration of an entire semiconductor optical amplifier device according to a third embodiment of the present invention.

FIG. 8 is a schematic view illustrating the configuration of an entire semiconductor optical amplifier device 100b according to a third embodiment of the present invention. As illustrated in FIG. 8, the difference of the semiconductor optical amplifier device 100b from the semiconductor optical amplifier device 100 of FIG. 2 is that a controller 70b is provided in place of the controller 70. The controller 70b includes a rising edge detector 72 and a current value holding circuit 73.

In this embodiment, the rising edge detector 72 detects the rising edge of the input optical signal in response to the detection result of the power monitor 60. Furthermore, the controller 70 supplies driving current corresponding to the detection result of the power monitor 60 to the active layer of the semiconductor optical amplifier 30 by referring to the correspondence table 71. The current value holding circuit 73 holds the driving current until the rising edge detector 72 detects the next rising edge. In this case, even in a case where an optical signal is no longer input, electrical current is supplied to the active layer of the semiconductor optical amplifier 30. As a result, variations in the gain in the semiconductor optical amplifier 30 are suppressed.

Figure 9:
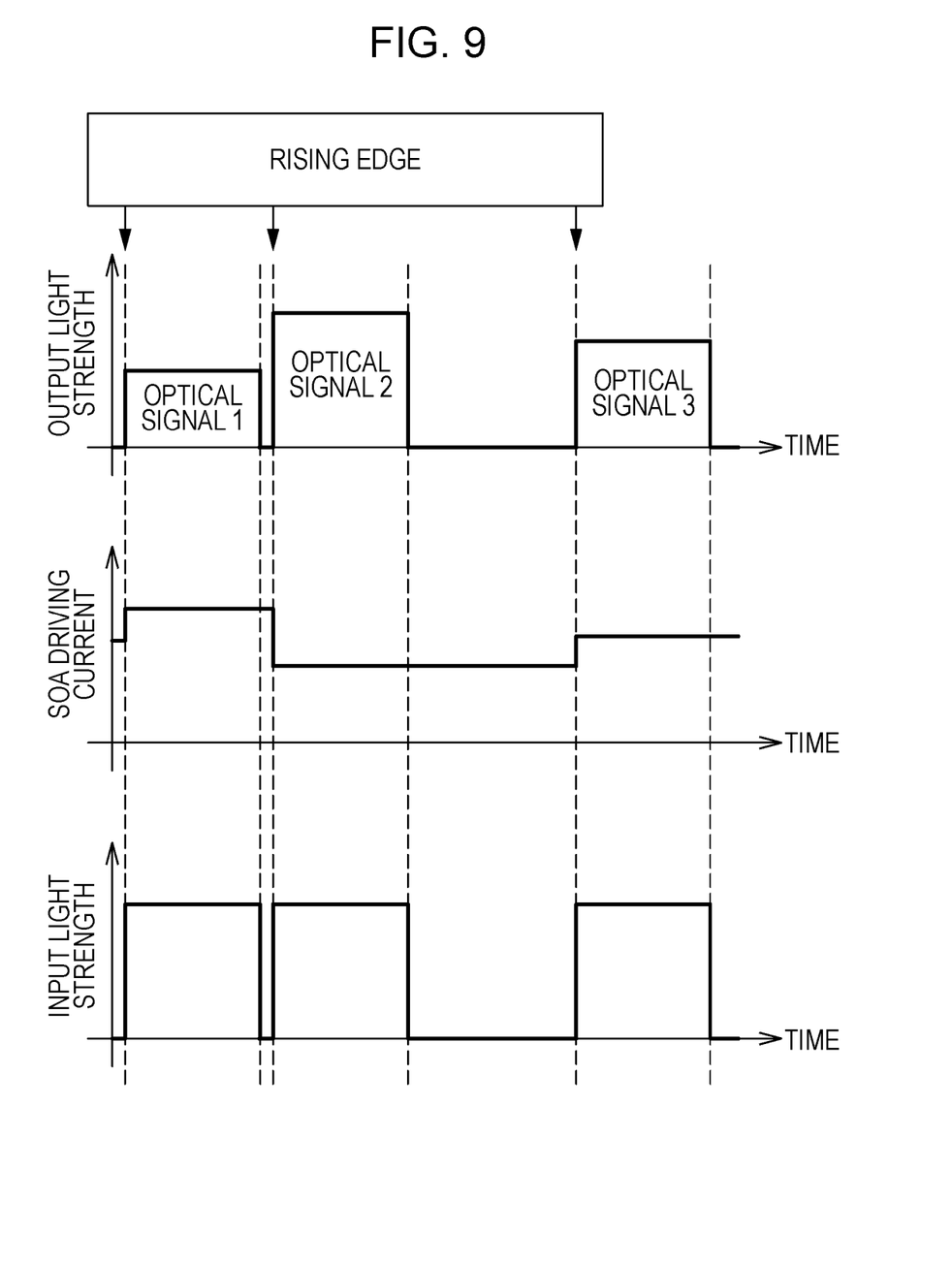
FIG. 9 illustrates output light in a case where an optical burst signal is input to a semiconductor optical amplifier as in FIG. 4.

FIG. 9 illustrates output light in a case where an optical burst signal is input to the semiconductor optical amplifier 30 as in FIG. 4. In a case where an optical signal 1 is input, the rising edge detector 72 detects a rising edge. In response, the current value holding circuit 73 holds the driving current value held in the correspondence table 71 until an optical signal 2 is input. When the optical signal 2 is input next, the rising edge detector 72 detects a rising edge. In response, the current value holding circuit 73 holds the driving current value held in the correspondence table 71 until an optical signal 3 is input.

Therefore, even if the interval between the optical signal 2 and the optical signal 3 is increased, temperature changes of the semiconductor optical amplifier 30 are suppressed. In consequence, variations in the gain of the semiconductor optical amplifier 30 are suppressed. As a result, an overshoot excessive gain is suppressed.

According to various embodiments of the semiconductor optical amplifier device as disclosed herein, it is possible to suppress variations in the gain of a semiconductor optical amplifier to which an optical burst signal is input.

All examples and conditional language recited herein are intended for pedagogical objects to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

The invention claimed is:

1. An apparatus comprising:
   an optical line terminal (OLT) configured to supply, to a network, preheat current information, drive current information, and time slot information which are used for amplifying input optical burst signals in an upstream direction;
   a semiconductor optical amplifier configured to amplify the input optical burst signals, no optical signal being included between the input optical burst signals; and
   a controller configured to supply, based on the preheat current information, the drive current information, and the time slot information which are received from the network, preheat currents corresponding to the no optical signal periods between the input optical burst signals and drive currents corresponding to the input optical burst signals in time slots to the semiconductor optical amplifier so as to maintain a constant output level of the input optical burst signals output from the semiconductor optical amplifier and suppress an overshoot gain.

2. The apparatus according to claim 1, further comprising a monitor configured to detect light intensities of the input optical burst signals before the optical burst signals are input to the semiconductor optical amplifier,
   wherein the controller detects whether each of the input optical burst signals input to the semiconductor optical amplifier in accordance with the detection result of the monitor.

3. The apparatus according to claim 2, further comprising a delay unit that delays a propagation of the input optical burst signals,
   wherein the input optical burst signals delayed by the delay unit are input to the semiconductor optical amplifier, and
   wherein the monitor detects amounts of the light intensities of the input optical burst signals delayed by the delay unit.

4. The apparatus according to claim 1, wherein the input optical burst signals correspond to transmission sources.

5. The apparatus according to claim 1, further comprising an optical filter configured to substantially cut off noise light generated as a result of the supply of the preheat current to the semiconductor optical amplifier, an output light of the semiconductor optical amplifier being input to the optical filter.

6. The apparatus according to claim 1, wherein the controller includes a memory in which correspondences between different light intensities of the input optical burst signals and supply currents for the semiconductor optical amplifier are stored, and the controller controls the preheat current based on the correspondences.

7. The apparatus according to claim 1, wherein the controller includes a rising edge detector configured to detect a rising edge of each of the input optical burst signals, and a current value holding circuit configured to hold an electrical current value to be supplied to the semiconductor optical amplifier when the rising edge is detected by the rising edge detector.

8. The apparatus according to claim 7, wherein the current value holding circuit is configured to hold the electrical current value until a next rising edge of another each of input optical burst signals is detected by the rising edge detector.

9. The apparatus according to claim 8, wherein the input optical burst signals, each have a first state in which an optical signal exists and a second state in which an optical signal does not exist, each of the optical burst signals corresponding to a time slot for a transmission source.

10. An apparatus comprising:
an optical line terminal (OLT) configured to supply, to a network, preheat current information and drive current information for input optical burst signals in an upstream direction;
semiconductor optical amplifier configured to amplify the input optical burst signals, no optical signal being included between the input optical burst signals; and
a controller configured to supply, based on the preheat current information and the drive current information received from the network, preheat currents corresponding to the no optical signal periods between the input optical burst signals and drive currents corresponding to the input optical burst signals to the semiconductor optical amplifier so as to maintain a constant output level of the input optical burst signals output from the semiconductor optical amplifier and suppress an overshoot gain.

11. The apparatus according to claim 10, wherein output power level of the semiconductor optical amplifier is controlled by the controller so as to be a fixed light intensity where the first burst signal and the second burst signal have different optical power levels.

12. An apparatus comprising:
semiconductor optical amplifier configured to amplify an input optical burst signal; and
controller configured to supply, based on preheat current information and drive current information for input optical burst signals in an upstream direction, received from an optical line terminal (OLT), a preheat current to the semiconductor optical amplifier when the input optical burst signal is not input to the semiconductor optical amplifier and drive currents corresponding to the input optical burst signals to the semiconductor optical amplifier.

\* \* \* \* \*